United States Patent
Ko et al.

(10) Patent No.: US 7,524,690 B2
(45) Date of Patent: Apr. 28, 2009

(54) IMAGE SENSOR WITH A WAVEGUIDE TUBE AND A RELATED FABRICATION METHOD

(75) Inventors: Teng-Yuan Ko, Hsin-Chu Hsien (TW); Nien-Tsu Peng, Hsin-Chu (TW); Kuen-Chu Chen, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 302 days.

(21) Appl. No.: 11/463,882

(22) Filed: Aug. 10, 2006

(65) Prior Publication Data
US 2008/0036020 A1    Feb. 14, 2008

(51) Int. Cl.
*H01L 21/00*    (2006.01)
*H01L 31/0232*    (2006.01)
(52) U.S. Cl. ........................ 438/31; 257/436
(58) Field of Classification Search ......... 257/431–437, 257/444, 461; 438/29–31
See application file for complete search history.

(56) References Cited

U.S. PATENT DOCUMENTS

| | | | |
|---|---|---|---|
| 4,914,301 A | * | 4/1990 | Akai .................. 250/370.01 |
| 5,943,463 A | | 8/1999 | Unuma |
| 6,018,169 A | | 1/2000 | Tohyama |
| 6,130,422 A | * | 10/2000 | Bawolek et al. ........ 250/208.1 |
| 6,724,425 B1 | | 4/2004 | Moon |
| 6,858,868 B2 | | 2/2005 | Nagata |
| 6,861,866 B2 | | 3/2005 | Han |
| 6,872,584 B2 | | 3/2005 | Nakashiba |
| 6,969,899 B2 | * | 11/2005 | Yaung et al. ............... 257/436 |
| 2006/0049439 A1 | | 3/2006 | Oh |

FOREIGN PATENT DOCUMENTS

CN    1630090 A    6/2005

* cited by examiner

*Primary Examiner*—Calvin Lee
(74) *Attorney, Agent, or Firm*—Winston Hsu

(57) ABSTRACT

An image sensor includes a substrate, at least an optical device, at least a dielectric layer, and at least a wave-guide tube disposed upon the optical device. The wave-guide tube has an optical barrier disposed on a sidewall thereof and a filter layer filled in the wave-guide tube. The structure of the wave-guide tube has the advantages of shortening light path, focusing, and preventing undesirable crosstalk effect between different optical devices.

33 Claims, 11 Drawing Sheets

IMAGE SENSOR WITH A WAVEGUIDE TUBE AND A RELATED FABRICATION METHOD

BACKGROUND OF THE INVENTION

1. Field of the Invention

The present invention is related to integrated image sensors, and more particularly, the present invention teaches an image sensor that uses a wave-guide tube.

2. Description of the Prior Art

CMOS image sensors (CIS) are popular image sensors at present. CIS fabrication can be integrated into conventional semiconductor processes, and therefore CIS has advantages of low cost, tiny size, and high integration. CIS also has advantages of low operating voltage, less power consumption, high quantum efficiency, low read-out noise, and random access. Therefore, CIS is adopted broadly in electronic products, such as PC cameras and digital cameras.

A conventional CIS structure may be divided by function into a light sensing area and a peripheral electronic circuit area. The light sensing area has a plurality of photodiodes arranged in an array, and MOS transistors to sense light intensity, i.e. a reset transistor, a current source follower and a row selector. The peripheral electronic circuit area connects interconnects to external connections. A principle function of the CIS is to divide incident beams into combinations of light with different wavelengths. The light is received by a plurality of imaging devices on the semiconductor substrate and transformed into digital signals of different intensity. For instance, an incident beam is divided into a combination of red, green and blue light and received by corresponding photodiodes. Each photodiode transforms the light intensity into digital signals. In addition, the photodiodes handle the digital signals based on light currents generated in the light sensing area. For example, a light current generated during illumination is regarded as signal, and a dark current generated during darkness is regard as noise. Therefore, the photodiode compares the intensity of the signal and the noise, and accordingly transfers the result to the peripheral electronic circuit.

Please refer to FIG. 1. FIG. 1 is a schematic diagram of a traditional CIS structure, which includes a semiconductor substrate 10 and a plurality of photodiodes 11,12 and 13 formed therein. Each photodiode has an N-type region 16 and a P-type region 17 forming a device for sensing light intensity. Each photodiode is separated from other photodiodes by an array of shallow trench isolation (STI) structures 14. Thus, an array of pixels is formed. To achieve an intact CIS structure, multilevel interconnects are employed. For instance, the semiconductor substrate 10 is covered by a series of dielectric layers, such as an interlevel dielectric (ILD) layer 20 and intermetal dielectric (IMD) layers 22 and 24. Further, a wire pattern of interconnects (not shown) and metal lines 23 and 25 are formed in the IMD layers 22 and 24.

Incident light 32 and 34 from a light source 30 strikes a surface of the topmost IMD layer 24. This light is transmitted through the IMD layer 22 and the ILD layer 20 down to the photodiodes 11, 12 and 13 and a consequent electric signal is induced. The incident light 32 and 34 often strikes the surface of the IMD layer 24 at a variety of angles. For instance, the incident light 32 strikes the surface at a near perpendicular angle, and the incident light 34 strikes the surface at a non-perpendicular angle. The incident light 32 that strikes the surface of the IMD layer 24 at a perpendicular angle is transmitted to the photodiode 12 underlying the strike location. This is optimal for image sensing performance. However, the incident light 34 that strikes the surface of the IMD layer 24 at a non-perpendicular angle is transmitted to the metal line 25. The incident light 34 then reflects off the surface of the metal line 25 and is transmitted to the nearby photodiode 13 rather than to the photodiode 12 due to light scattering. This effect is called "crosstalk." The light scattering problem causes interference in the photodiode 13 from the incident light 34, and results in a degraded signal-to-noise ratio (SNR). And, obviously, the crosstalk effect reduces CIS imaging sensitivity.

To overcome the crosstalk problem, U.S. Pat. No. 6,861,866 provides an improved CIS structure. FIG. 2 is a schematic diagram of a CIS structure according to U.S. Pat. No. 6,861,866. The CIS structure is defined as an image sensing area 40 on the left and an interconnect area 42 on the right. The CIS structure includes a substrate 44, a plurality of IMD layers 46, and a plurality of diffusion barrier layers 48 positioned on the substrate 44. The interconnects area 42 has a plurality of metal lines 50, which connect to a gate 52 and a source/drain 54 to control signal transduction from the CIS. The image sensing area 40 includes a photodiode 56 disposed on a surface of the substrate 44 and a light passageway 58 positioned above the photodiode 56. The light passageway 58 has an inside wall 62 formed by a plurality of metal barriers 60, a protective layer 64 disposed on the inside wall 62 and a surface of the IMD layers 46 to prevent the crosstalk effect, and a transparent filler 66 embedded in the light passageway 58. The image sensing area 40 also has a color filter 68 disposed on the transparent filler 66 and a microlens 70 formed above the light passageway 58. However, the inside wall 62 is formed by connecting the metal barriers 60 of each layer, and thus has a discontinuous surface that tends to cause light scattering. Consequently, the photodiode 56 receives little valid light.

U.S. Pat. No. 6,969,899 also discloses a similar CIS structure. Please refer to FIG. 3, wherein a CIS structure has a substrate 72, a plurality of photodiodes 74 formed therein, and a plurality of STI 76 separating the photodiodes 74. The CIS structure also has a plurality of first dielectric layers 78 covering the substrate 72, and a plurality of light passageways 80 connected to the photodiodes 74. Each light passageway 80 includes a second dielectric layer 82 filled therein and a third dielectric layer 84 disposed on an inside wall of the light passageway 80 to prevent the crosstalk effect. Since the light passageways 80 connect directly to the photodiodes 74, the sensing surface of the photodiode 74 is easily damaged by plasma damage and impurities during fabrication. This results in surface defects and increases leakage current. Sensitivity of photodiodes 74 is therefore reduced, and the photodiodes 74 may even lose functionality.

SUMMARY OF THE INVENTION

It is therefore a primary objective of the present invention to provide an image sensor having at least a wave-guide tube for preventing a crosstalk effect and to increase sensitivity, and also to provide a method for fabricating the image sensor.

According to the present invention, an image sensor is disclosed. The image sensor comprises a substrate having at least an optical device therein, at least a dielectric layer disposed upon the substrate, and at least a wave-guide tube embedded in the dielectric layer. The wave-guide tube is positioned relative to the optical device at a predetermined distance and has a straight surface on its sidewall. The wave-guide tube includes a filler embedded in the dielectric layer and an optical barrier disposed on a sidewall of the filler. The dielectric layer, the filler, and the optical barrier have a refractive index $n_1$, a refractive index $n_2$, and a refractive index $n_3$, respectively. In addition, the refractive index $n_2$ is larger than the refractive index $n_3$.

According to the present invention, a method of fabricating an image sensor is disclosed. Initially, a substrate is provided and at least an optical device is formed therein. At least a dielectric layer is formed upon the substrate and covers the optical device. A trench being disposed relative to the optical device at a predetermined distance is formed in the dielectric layer. A straight optical barrier is formed on an inside wall of the trench, and a wave-guide tube is formed by filling the trench with a filler. The dielectric layer has a refractive index $n_1$, the filler has a refractive index $n_2$, and the optical barrier has a refractive index $n_3$, and the refractive index $n_2$ is greater than the refractive index $n_3$.

The image sensor of the present invention comprises at least a wave-guide tube having a concave bottom, which is positioned relative to the optical device at a predetermined distance. This prevents surface defects in the optical device and leakage current. The wave-guide tube further comprises an optical barrier to prevent the crosstalk effect between different optical paths. The optical barrier and the filler have different refractive indices, such that incident light striking at a non-perpendicular angle undergoes total internal reflection in the wave-guide tube. This results in a wave-guide effect. Therefore, the optical device collects more valid light beams to increase image sensing efficiency and sensitivity. The filler may be formed of dichroic film or a color filter to shorten a light path and to enhance a resolution of the image sensor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
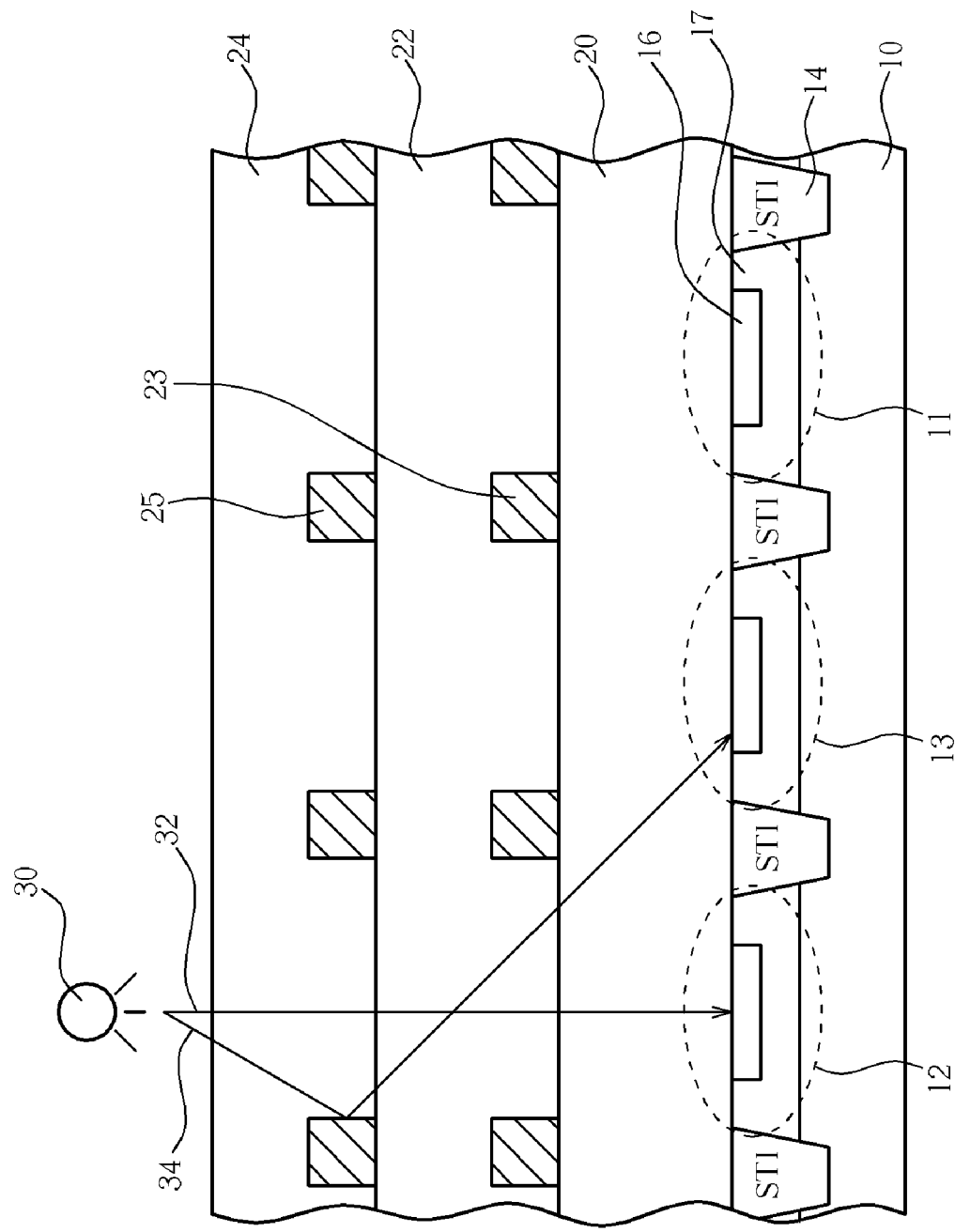
FIG. 1 is a schematic diagram of a CIS structure of the prior art.
Figure 2:
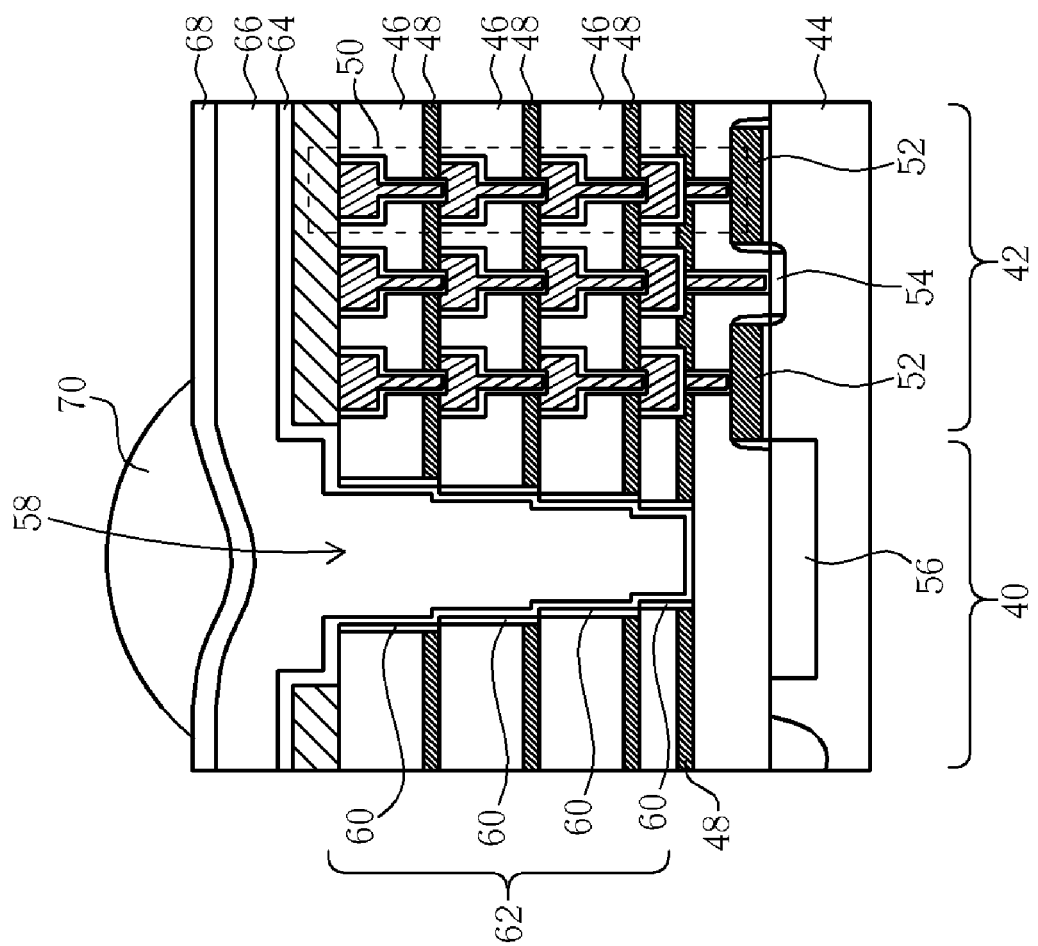
FIG. 2 is a schematic diagram of a CIS structure according to U.S. Pat. No. 6,861,866.
Figure 3:
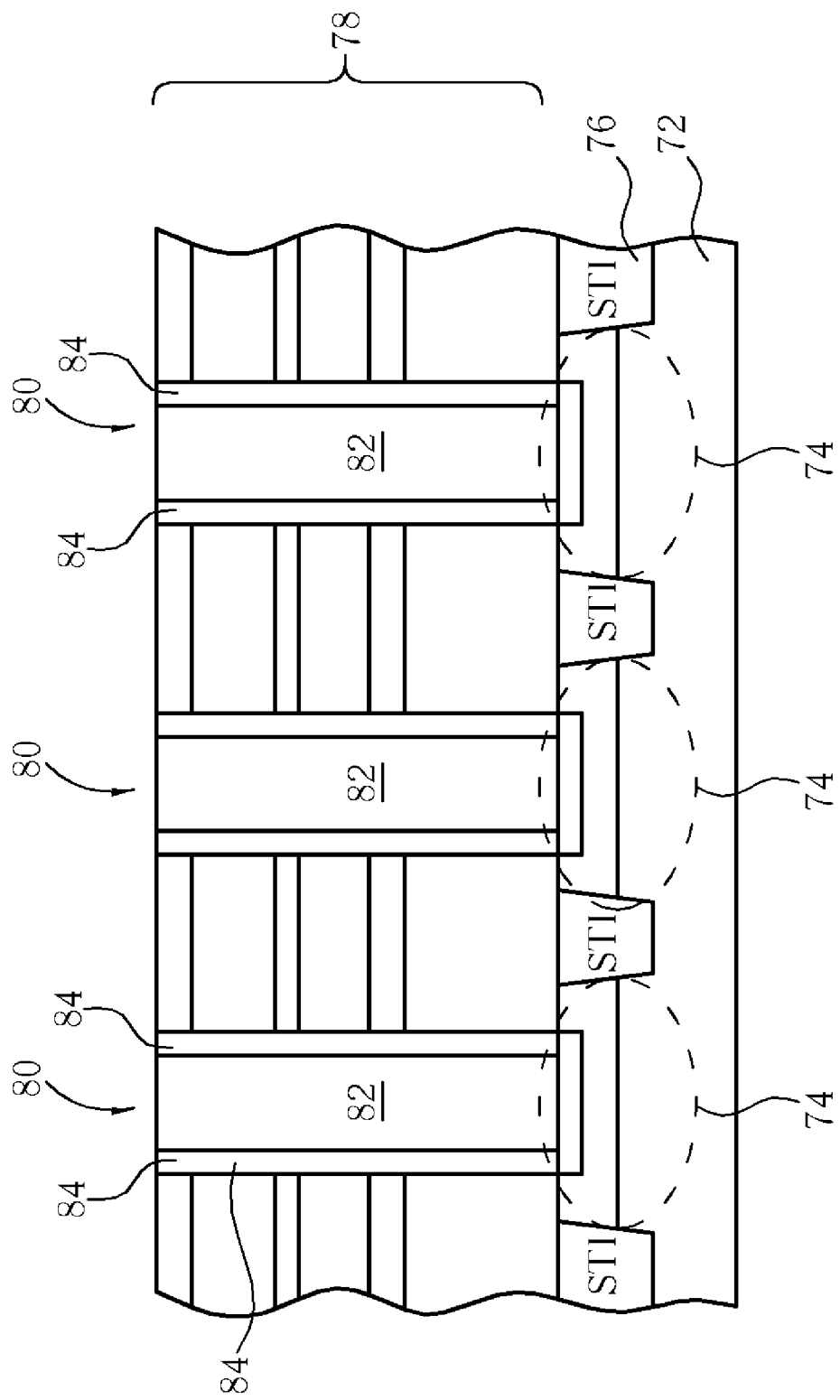
FIG. 3 is a schematic diagram of a CIS structure according to U.S. Pat. No. 6,969,899.
Figure 4:
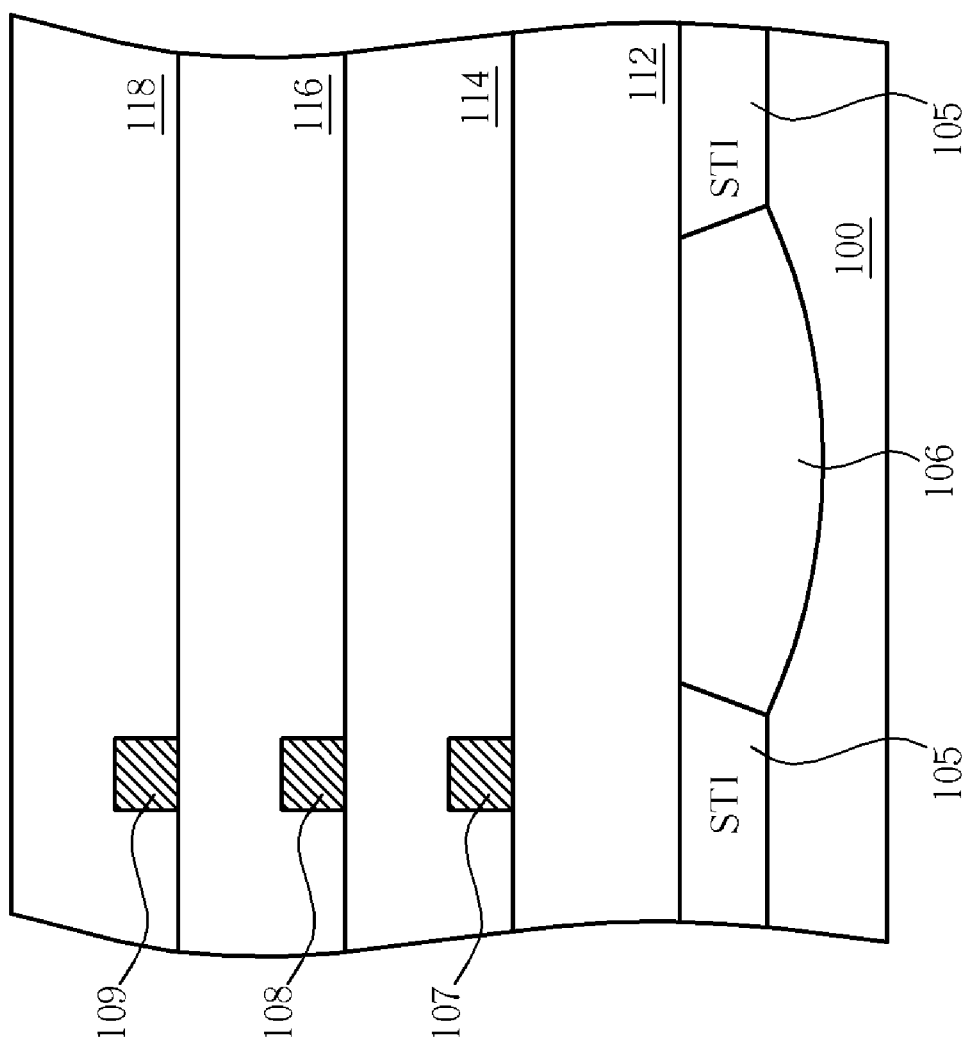
FIGS. 4 to 10 are schematic diagrams illustrating a method of fabricating an image sensor according to a preferred embodiment of the present invention.

In the following detailed description, reference is made to the accompanying drawings, which form a part of this application. The drawings show, by way of illustration, specific embodiments in which the invention may be practiced. It is to be understood that other embodiments may be utilized and structural changes may be made without departing from the scope of the present invention.

FIGS. 4 to 10 are schematic diagrams illustrating a method of fabricating an image sensor according to a preferred embodiment of the present invention. A substrate 100 is provided wherein at least an optical device 106 is formed, and at least an insulator 105 separates the optical device 106. At least an interlevel dielectric (ILD) layer 112 and a plurality of intermetal dielectric (IMD) layers 114, 116 and 118 are formed on the substrate 100, and a plurality of metal lines 107, 108 and 109 are formed in the IMD layers 114,116 and 118. In the preferred embodiment, the substrate 100 is a semiconductor substrate, though other kinds of substrate are allowable, such as a wafer or a silicon-on-insulator (SOI) substrate. The optical device 106 may be a photodiode for receiving light to determine light intensity. The optical device 106 may further connect to a CMOS transistor (not shown), i.e. a reset transistor, a current source follower or a row selector. The insulator 105 may be a STI or a local oxidation of a silicon isolation layer (LOCOS) to prevent a short circuit resulting from a connection of the optical device 106 to other devices. The ILD layer 112 may comprise silicon oxide or borophosposilicated glass (BPSG), and the IMD layer 114, 116 and 118 may comprise SiON or fluoride silicate glass (FSG). The metal lines 107, 108 and 109 are fabricated by a dual damascene process to construct multilevel interconnects.

Figure 5:
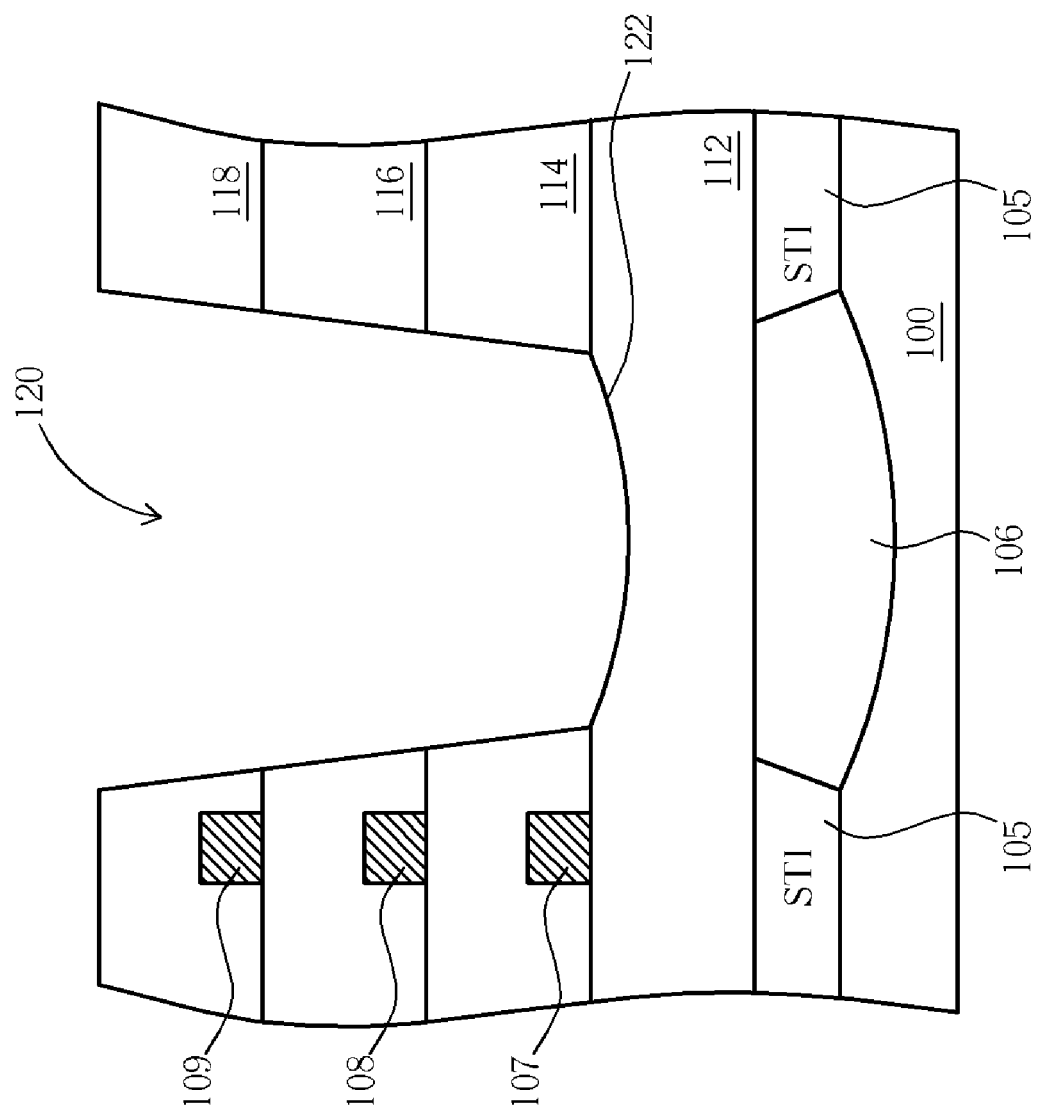

As shown in FIG. 5, a patterned photoresist layer (not shown) is formed on a surface of the IMD layer 118. The patterned photoresist layer is used as a mask when an etching process, especially a dry etching process, is performed to define a trench 120 in the IMD layer 114, 116 and 118. The trench 120 inherently has an opening having a larger diameter than a diameter of a concave bottom 122 after etching; for instance, the diameter of the concave bottom 122 is 75%-95% of the diameter of the opening, and preferably more than 95% to keep a sidewall of the trench 120 approximately vertical. The funnel-shaped structure of the trench allows for more effective light transmission and is favorable for a following deposition process. The trench 120 of the present embodiment may be formed by different processes. For example, a dry etching process can be performed to etch the IMD layer 114, 116 and 118, and a wet etching process can be performed subsequently to etch the ILD layer 112 to form the concave bottom 122. In addition the trench 120 may be formed by controlling the etching index of the abovementioned dry etching process to etch the IMD layer 114, 116 and 118 to form the concave bottom 122. The etching process is performed to etch a plurality of dielectric layers, and therefore the trench 120 has a straight inside wall that does not cause light scattering. Additionally, the trench 120 may be formed as a tube-shaped structure or a pillar-shaped structure having a constant diameter from top to bottom. The trench 120 may have a flat bottom or other kinds of bottoms for different desired focusing characteristics.

It should be noted that the concave bottom 122 of the trench 120 is positioned relative to the optical device 106 at a predetermined distance. In the preferred embodiment, the predetermined distance equals a thickness of the ILD layer 112. That means the etching process is performed to etch the IMD layer 114, 116 and 118 and stop at the surface of the ILD layer 112. The predetermined distance may be adjusted according to requirements or flexure radius of the concave bottom 122. The predetermined distance protects the surface of the optical device 106 from damages during the etching process or other following processes to improve reliability of the image sensor.

Figure 6:
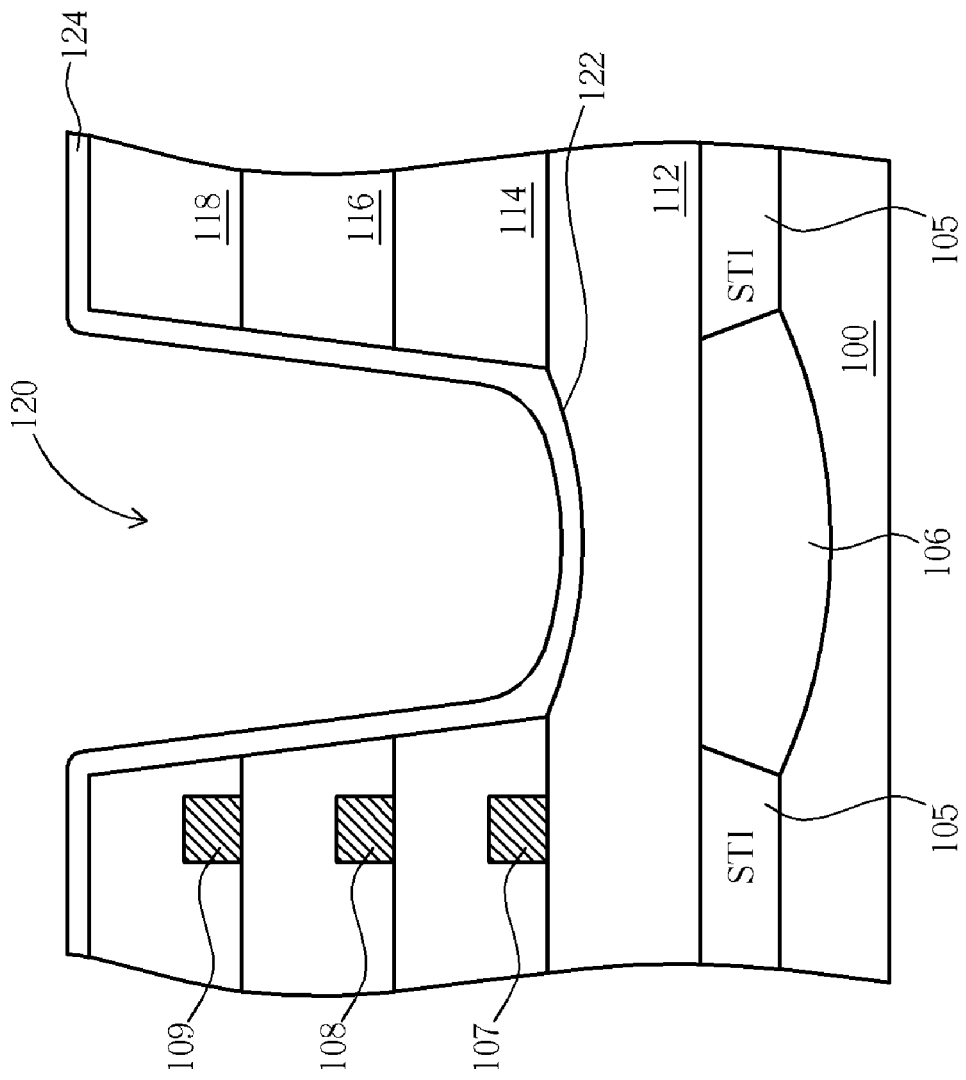

As shown in FIG. 6, a deposition process is performed to form a straight optical barrier 124 on a surface of the IMD layer 118, the concave bottom 122, and the inside wall of the trench 120. The deposition process may include a chemical vapor deposition (CVD) process, a high-temperature deposition process, a plasma enhanced chemical vapor deposition (PECVD) process, and a physical vapor deposition (PVD) process. In the preferred embodiment, the ILD layer 112 and the IMD layers 114,116 and 118 have a refractive index greater than that of the optical barrier 120. For instance, the ILD layer 112 and the IMD layers 114,116 and 118 have the same refractive index $n_1$, and the optical barrier 124 has a refractive index $n_3$. The refractive index $n_1$ is greater than the refractive index $n_3$. The material of the optical barrier 124 comprises titanium oxide, silicon oxide, or another substance meeting the aforementioned requirement. Because metal has great reflectivity, the optical barrier 124 may be replaced by a metal barrier to block the crosstalk effect between different optical devices.

Figure 7:
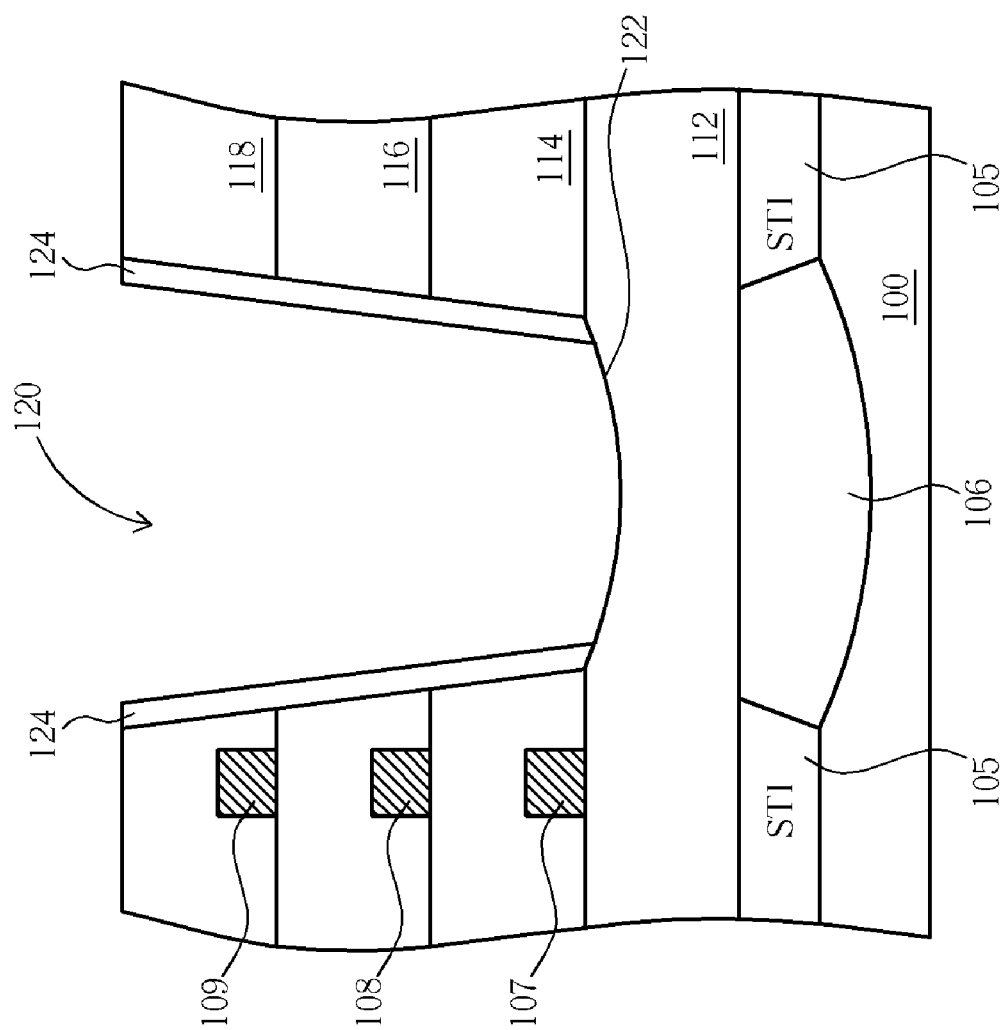
Figure 8:
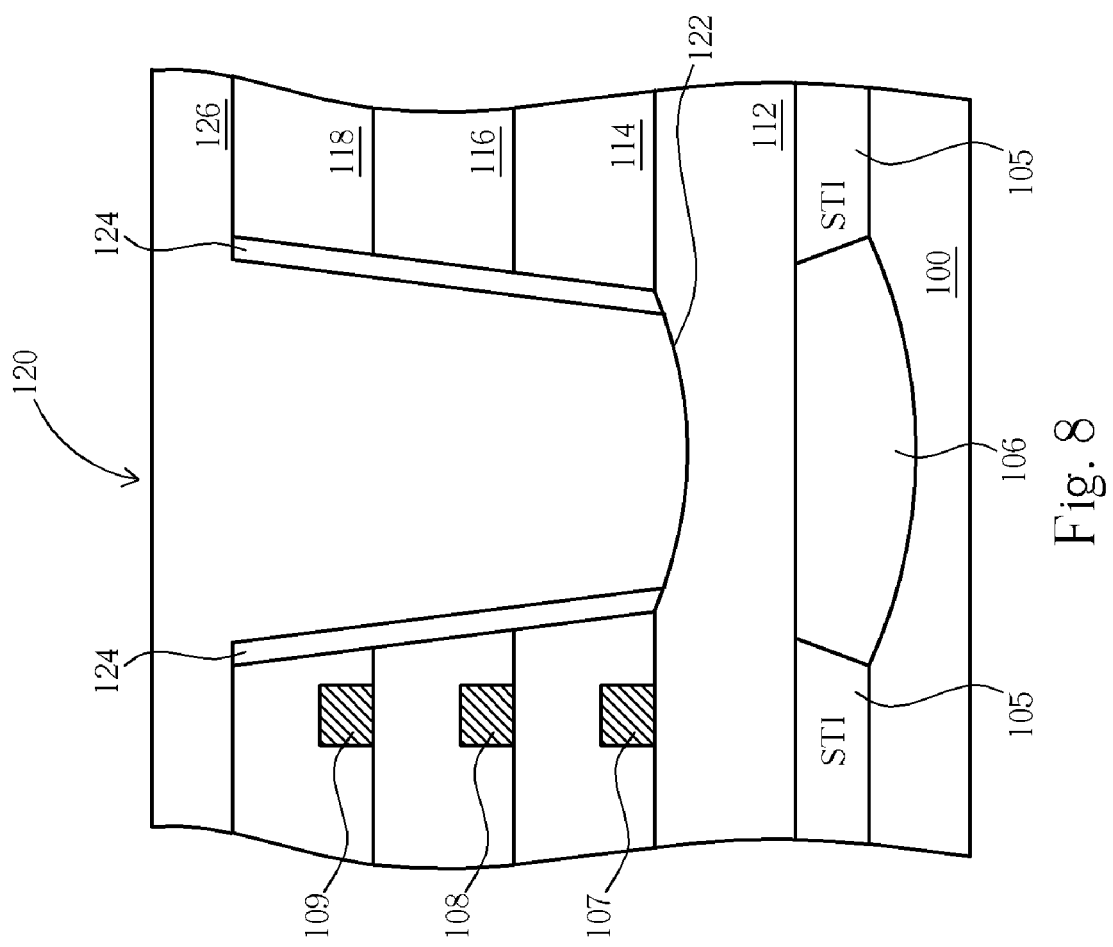

As shown in FIG. 7, an etching back process is performed to remove a part of the optical barrier 124 formed on the surface of the IMD layer 118 and the concave bottom 122. The optical barrier 124 on the inside wall of the trench 120 is preserved. Referring to FIG. 8, another deposition process is performed to deposit a filler 126 on the surface of the IMD layer 118 and the optical barrier 124, and to fill the trench 120. The deposition process may employ a spin-on glass (SOG) process, a chemical vapor deposition (CVD) process, a high-temperature deposition process, a plasma enhanced chemical vapor deposition (PECVD) process, and a physical vapor deposition (PVD) process. In the preferred embodiment, the filler 126 may use dichroic film materials, such as titanium oxide, or tantalum oxide. Color filter materials are also allowable for forming the filler 126, such as resin with color dyes, color photoresist, other suitable substances for fabricating a color filter, and even a transmittable transparent substance is allowable.

Figure 9:
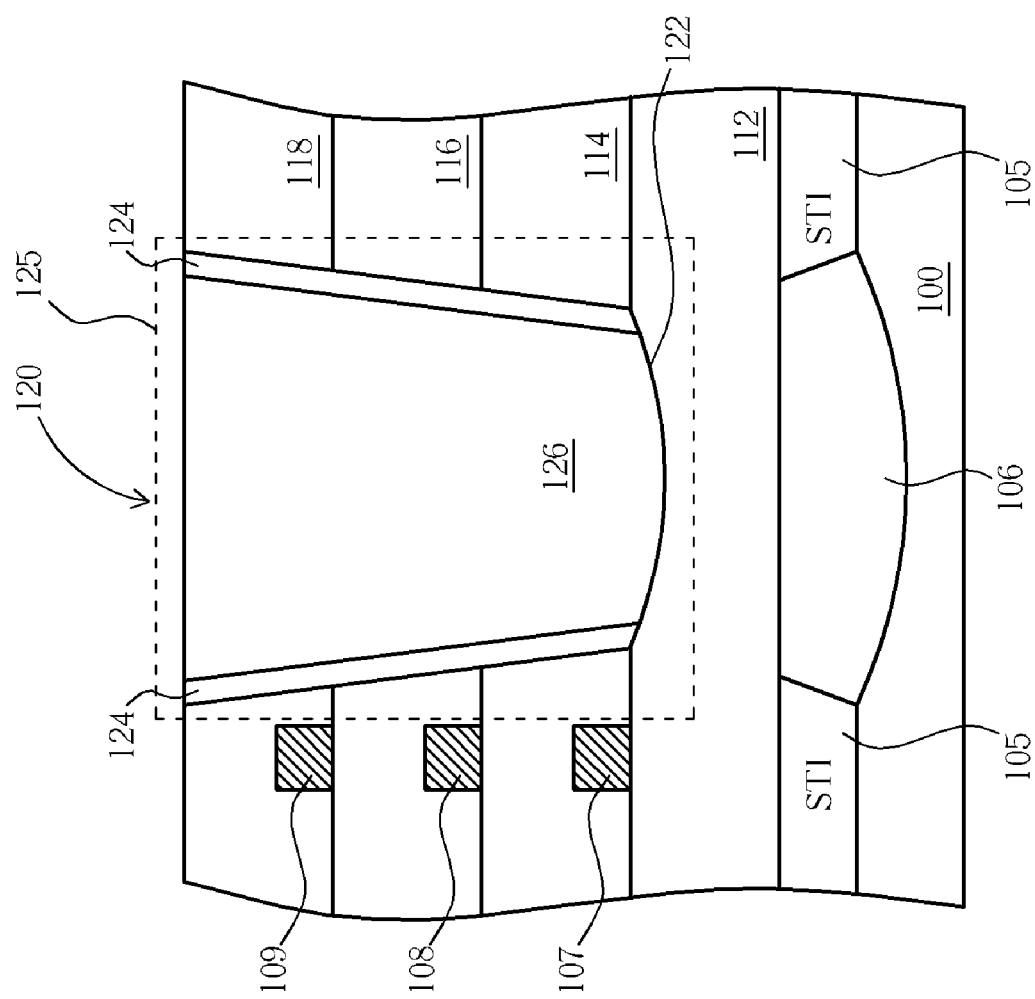

As shown in FIG. 9, a planarization process, such as a chemical mechanical polish (CMP), is performed to remove a part of the filler 126 on the IMD layer 118 and to planarize a surface of the filler 126 and the surface of the IMD layer 118. Thus, the trench 120, the optical barrier 124, and the filler 126 form a wave-guide tube 125 of the present invention.

It should be noted that the filler 126 has a refractive index $n_2$, which is greater than the refractive index $n_3$ of the optical barrier 124. If an incident light ray strikes the optical barrier 124 at a non-perpendicular angle, the incident light will be reflected on the surface of the optical barrier 124 and transmitted to the optical device 106. Therefore, a wave-guide effect is formed. The incident light will not be transmitted through the IMD layers 114, 116 and 118, and the ILD layer 112. This prevents the crosstalk problem.

Figure 10:
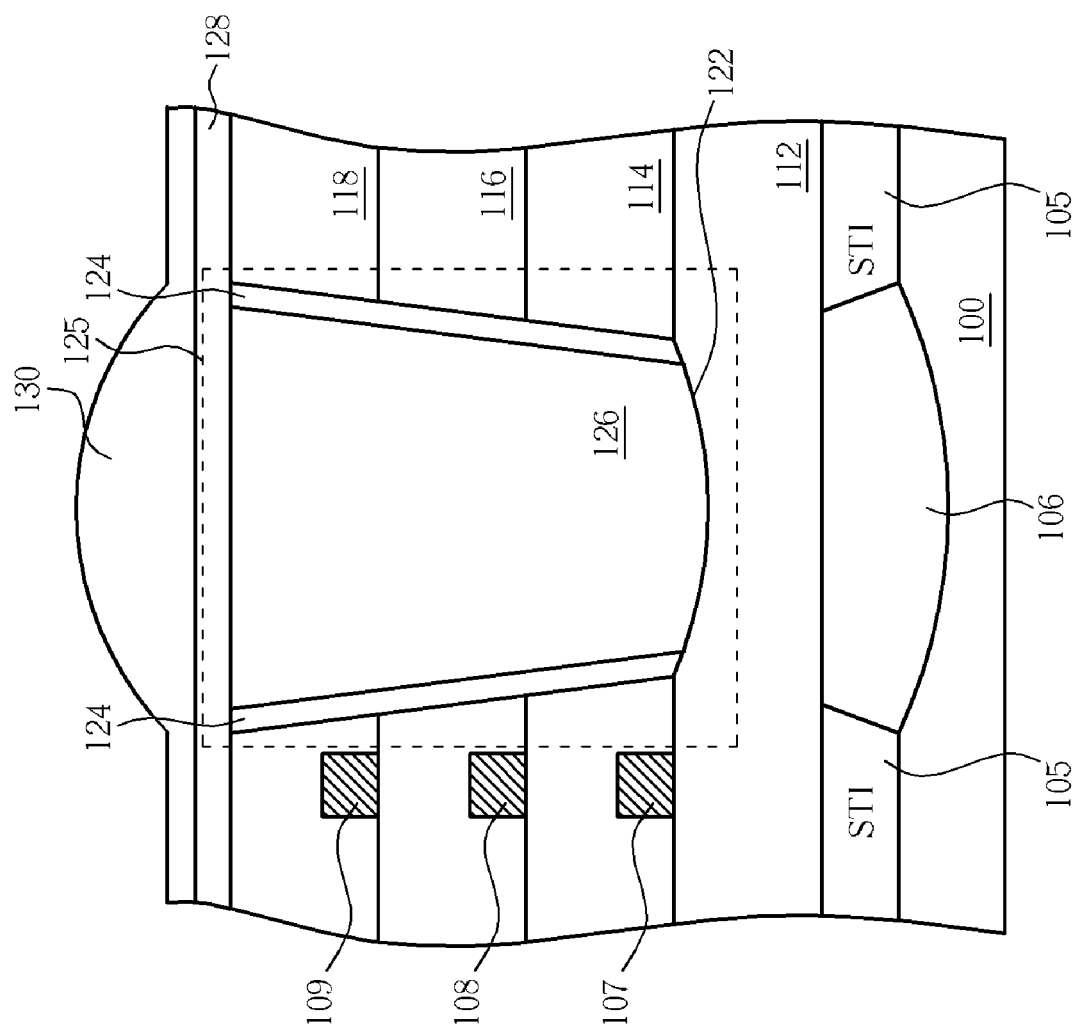

As shown in FIG. 10, a planar layer 128 and a microlens 130 are formed upon the IMD layer 118 and the wave-guide tube 125. The planar layer 128 protects the underlying IMD 118 and the wave-guide tube 125 and forms a planar surface, which is favorable for following processes to form the microlens 130. The planar layer 128 may be formed as a transparent film, which comprises silicon oxide, resin, or other transparent materials. The microlens 130 may be formed by forming a patterned polymer on the planar layer 128, and following with a thermal annealing process. The microlens 130 improves a focus efficiency of the image sensor. If the filler 126 is formed of a transparent substance, the image sensor may further comprise a color filter (not shown) disposed between the planar layer 128 and the microlens 130.

Figure 11:
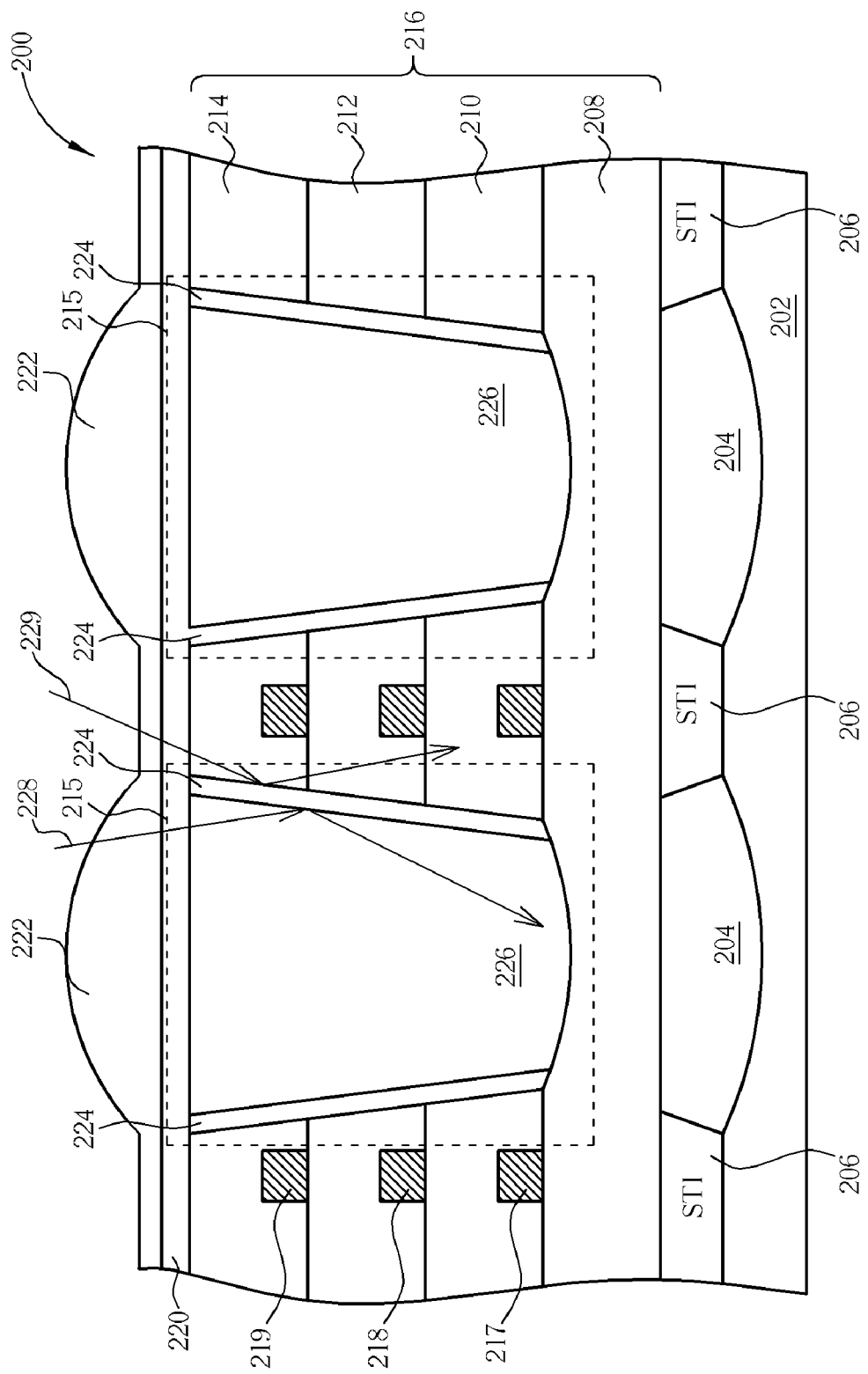
FIG. 11 is a schematic diagram of an image sensor comprising a plurality of wave-guide tubes according to another preferred embodiment of the present invention.

The method of the present invention may also be used to fabricate an image sensor having a plurality of wave-guide tubes. Please refer to FIG. 11, which illustrates an image sensor 200 comprising a plurality of wave-guide tubes according to another preferred embodiment of the present invention. The image sensor 200 includes a substrate 202, at least an optical device 204 formed in the substrate 202, at least a dielectric layer 216 covering the substrate 202, and at least a wave-guide tube 215 disposed therein. In the preferred embodiment, the dielectric layer 216 includes at least an ILD layer 208 and a plurality of IMD layers 210, 212 and 214. Further, a wire pattern of interconnections (not shown) comprising a plurality of metal lines 217, 218 and 219 is disposed in the IMD layers 210, 212 and 214 and connects the optical device 204 to external electronic circuits. Moreover, the optical device 204 is separated by an insulator 206, which prevents short circuits resulting from connections of the optical device 204 and other devices. The wave-guide tube 215 further comprises a concave bottom, an optical barrier 224, and a filler 226. An opening of the wave-guide tube 215 has a larger diameter than a diameter of the concave bottom of the wave-guide tube 215. The diameter of the concave bottom is 75%-95% of the diameter of the opening, and preferably more than 95%. The concave bottom of the wave-guide tube 215 is positioned relative to the optical device 204 at a predetermined distance, which equals a thickness of the ILD layer 208 to assure reliability of the optical device 204.

The image sensor 200 further has a planar layer 220 and at least a microlens 222 disposed on the dielectric layer 216 and the wave-guide tube 215 for protection and focusing. The sidewall of the wave-guide tube 215 has a straight surface. Consequently, when an incident light ray strikes the image sensor, light scattering does not occur. In the preferred embodiment, the ILD layer 208 and the IMD layers 210, 212 and 214 have a same refractive index $n_1$ and the optical barrier 224 has a refractive index $n_3$. The refractive index $n_1$ is greater than the refractive index $n_3$. An incident light ray 229 striking the optical barrier 224 reflects at an interface of the optical barrier 224 and the IMD layer 214 because of the difference between the refractive index $n_1$ and the refractive index $n_3$. In addition, the filler 226 has a refractive index $n_2$, which is greater than the refractive index $n_3$ of the optical barrier 224. An incident light ray 228 striking the optical device 224 reflects off the surface of the optical barrier 224 rather than passing through the dielectric layer 216. Accordingly, crosstalk does not occur. Considering that metal has great reflectivity, the optical barrier 224 may be replaced by a metal barrier to prevent crosstalk between different optical devices. Moreover, the image sensor 200 comprises the optical device 204, and the corresponding wave-guide tube 215 may be used as an image sensor having an optical device array, such as a dichroic film array or a color filter array of red, green, blue, or another color, filters that may be adapted to related electronic products.

As described above, the present invention provides an image sensor and a method for fabricating the image sensor. The concave bottom of the wave-guide tube is positioned relative to the optical device at a predetermined distance to prevent surface defects in the optical device and to prevent leakage current. The wave-guide tube has an optical barrier on the sidewall thereof to prevent crosstalk between different light paths. Due to differences between refractive indices, incident light striking the image sensor at a non-perpendicular angle is reflected, resulting in a wave-guide effect, which improves imaging efficiency of the image sensor. Moreover, the filler may use materials, such as dichroic film or color filters, to shorten the light path and enhance resolution of the image sensor.

Those skilled in the art will readily observe that numerous modifications and alterations of the device and method may be made while retaining the teachings of the invention. Accordingly, the above disclosure should be construed as limited only by the metes and bounds of the appended claims. Accordingly, the above disclosure should be construed as limited only by the metes and bounds of the appended claims.

What is claimed is:

1. A method of fabricating an image sensor comprising:
   providing a substrate having at least an optical device;
   forming at least a dielectric layer on the substrate, the dielectric layer covering the optical device;

forming a trench in the dielectric layer, the trench having a bottom disposed relative to the optical device at a predetermined distance;

forming a straight metal barrier on an inside wall of the trench; and forming a color filter to fill the trench to form a wave-guide tube.

2. The method of claim 1 wherein the dielectric layer comprises at least an interlevel dielectric layer and at least an intermetal dielectric layer on the interlevel dielectric layer.

3. The method of claim 2, wherein the predetermined distance is equal to a thickness of the interlevel dielectric layer.

4. The method of claim 1, wherein the bottom of the trench comprises a concave bottom.

5. The method of claim 4, wherein forming the metal barrier on the inside wall of the trench comprises steps of:

performing a deposition process to deposit the metal barrier on a surface of the dielectric layer, the inside wall of the trench, and the concave bottom of the trench; and performing an etching process to remove a part of the metal barrier on the surface of the dielectric layer and the concave bottom of the trench.

6. The method of claim 1, wherein forming the color filter to fill the trench comprises steps of:

performing a deposition process to form the color filter on the surface of the dielectric layer and to fill the trench; and performing a planarization process to remove a part of the color filter on the dielectric layer and to planarize a surface of the color filter and the surface of the dielectric layer to flush with each other.

7. The method of claim 6, further comprising forming a microlens on the wave-guide tube after performing the planarization process.

8. An image sensor comprising:

a substrate comprising at least an optical device;

at least a dielectric layer disposed on the substrate;

at least a wave-guide tube embedded in the dielectric layer, the wave-guide tube having a bottom disposed relative to the optical device at a predetermined distance, wherein a sidewall of the wave-guide tube has a straight surface and the wave-guide tube comprises:

a color filter embedded in the dielectric layer; and a metal barrier disposed on a sidewall of the color filter.

9. The image sensor of claim 8, wherein the dielectric layer comprises at least an interlevel dielectric layer and at least an intermetal dielectric layer.

10. The image sensor of claim 9, wherein the predetermined distance is equal to a thickness of the interlevel dielectric layer.

11. The image sensor of claim 8, wherein the bottom of the wave-guide tube comprises a concave bottom.

12. The image sensor of claim 8, wherein the color filter is a dichroic film.

13. The image sensor of claim 8 further comprising a microlens disposed on the wave-guide tube.

14. The image sensor of claim 8, wherein the optical device is a photodiode.

15. The image sensor of claim 8, wherein the image sensor is a complementary metal-oxide-semiconductor (CMOS) image sensor.

16. A method of fabricating an image sensor comprising:

providing a substrate having at least an optical device;

forming at least a dielectric layer upon the substrate, the dielectric layer covering the optical device;

forming a trench in the dielectric layer, the trench having a bottom disposed relative to the optical device at a predetermined distance;

forming a straight optical barrier on an inside wall of the trench; and forming a wave-guide tube by filling the trench with a filler;

wherein the dielectric layer has refractive index $n_1$, the filler has a refractive index $n_2$, and the optical barrier has a refractive index $n_3$, and the refractive index $n_2$ is greater than the refractive index $n_3$.

17. The method of claim 16, wherein the dielectric layer comprises at least an interlevel dielectric layer and at least an intermetal dielectric layer on the interlevel dielectric layer.

18. The method of claim 17, wherein the predetermined distance is equal to a thickness of the interlevel dielectric layer.

19. The method of claim 16, wherein the bottom of the trench comprises a concave bottom.

20. The method of claim 19, wherein forming the optical barrier on the inside wall of the trench comprises steps of:

performing a deposition process to form the optical barrier on a surface of the dielectric layer, the inside wall of the trench, and the concave bottom of the trench; and performing an etching process to remove a part of the optical barrier on the surface of the dielectric layer and the concave bottom of the trench.

21. The method of claim 16, wherein filling the trench with the filler comprises steps of:

performing a deposition process to deposit the filler on the surface of the dielectric layer and to fill the trench; and performing a planarization process to remove a part of the filler on the dielectric layer and to planarize a surface of the filler and the surface of the dielectric layer to flush with each other.

22. The method of claim 21, further comprising forming a microlens on the wave-guide tube after performing the planarization process.

23. The method of claim 11, wherein the refractive index $n_1$ is greater than the refractive index $n_3$.

24. A image sensor comprising:

a substrate comprising at least an optical device;

at least a dielectric layer disposed on the substrate, the dielectric layer having a refractive index $n_1$;

at least a wave-guide tube embedded in the dielectric layer and the wave-guide tube having a bottom disposed relative to the optical device at a predetermined distance, wherein a sidewall of the wave-guide tube has a straight surface and the wave-guide tube comprises:

a filler embedded in the dielectric layer, the filler having a refractive index $n_2$;

an optical barrier disposed on a sidewall of the filler, the optical barrier having a refractive index $n_3$, wherein the refractive index $n_2$ is greater than the refractive index $n_3$.

25. The image sensor of claim 24, wherein the bottom of the wave-guide tube comprises a concave bottom.

26. The image sensor of claim 24, wherein the dielectric layer comprises at least an interlevel dielectric layer and at least an intermetal dielectric layer.

27. The image sensor of claim 26, wherein the predetermined distance is equal to a thickness of the interlevel dielectric layer.

28. The image sensor of claim 24, wherein the refractive index $n_1$ is greater than the refractive index $n_3$.

29. The image sensor of claim 24, wherein the filler is a dichroic film.

30. The image sensor of claim 24, wherein the filler is a color filter.

31. The image sensor of claim 24, further comprising a microlens disposed upon the wave-guide tube.

32. The image sensor of claim 24, wherein the optical device is a photodiode.

33. The image sensor of claim 24, wherein the image sensor is a complementary metal-oxide-semiconductor (CMOS) image sensor.

* * * * *